United States Patent [19]
Cole, Jr.

[11] Patent Number: 5,523,694
[45] Date of Patent: Jun. 4, 1996

[54] INTEGRATED CIRCUIT FAILURE ANALYSIS BY LOW-ENERGY CHARGE-INDUCED VOLTAGE ALTERATION

[76] Inventor: Edward I. Cole, Jr., 2116 White Cloud St., NE., Albuquerque, N.M. 87112

[21] Appl. No.: 225,119

[22] Filed: Apr. 8, 1994

[51] Int. Cl.$^6$ .................................................. G01R 31/00
[52] U.S. Cl. ...................................... 324/751; 324/158.1
[58] Field of Search ................................ 324/751, 158.1; 250/310, 311; 356/400

[56] References Cited

U.S. PATENT DOCUMENTS

| | | | |
|---|---|---|---|
| 4,629,898 | 12/1986 | Oulaff | 324/158.1 |
| 5,053,699 | 10/1991 | Atoh | 324/73.1 |
| 5,376,833 | 12/1994 | Kaito | 324/158.1 |

OTHER PUBLICATIONS

E. I. Cole, Jr. et al. "Low Electron Beam Energy CIVA Analysis of Passivated ICS," Conference Paper to be presented at the International Symposium for Testing and Failure Analysis, Los Angeles, CA, Nov. 13–18, 1994.

J. M. Soden and R. E. Anderson, "IC Failure Analysis: Technques and Tools for Quality and Reliability Improvement," *Proceedings of the IEEE*, vol. 81, pp. 703–715, May 1993.

E. I. Cole, Jr. et al., "Advanced Scanning Electron Microscopy Methods and Applications to Integrated Circuit Failure Analysis," *Scanning Microscopy*, vol. 2, No. 1, pp. 133–150, 1988.

E. I. Cole, Jr., "A New Technique for Imaging the Logic State of Passivated Conductors: Biofed Resistive Contrast Imaging," in *Proceedings of the 1990 International Reliability Physics Symposium*, New Orleans, LA, Mar. 27–29, 1990.

W. Reiners et al., "Electron Beam Testing of Passivated Devices via Capacitive Coupling Voltage Contrast," *Scanning Microscopy*, vol. 2, No. 1, pp. 161–175, 1988.

E. I. Cole, Jr. and R. E. Anderson, "Rapid Localization of IC Open Conductors Using Change–Induced Voltage Alternation," in *Proceedings of the 1992 International Reliability Physics Symposium* [IEEE, 1992] San Diego, CA, Mar. 30–Apr. 2, 1992.

S. Gorlich and K. Kubulch, "Electron Beam Induced Damage in Passivated Metal Oxide Semiconductor Devices," *Scanning Electron Microscopy*, vol. 1, pp. 87–95, 1985.

H. Seiler, "Secondary Electron Emission," in *Electron Beam Inductors with Solids* [Scanning Electron Microscopy, Inc., 1982] pp. 33–42.

K. Kanaya and S. Ono, "Interaction of Electron Beams with the Target in Scanning Electron Microscope," in *Electron Beam Interaction with Solids* [Scanning Electron Microscopy, Inc., 1982] pp. 69–98.

*Primary Examiner*—Kenneth A. Wieder
*Assistant Examiner*—Mark Wardas
*Attorney, Agent, or Firm*—John P. Hohimer; George H. Libman

[57] ABSTRACT

A scanning electron microscope apparatus and method are described for detecting and imaging open-circuit defects in an integrated circuit (IC). The invention uses a low-energy high-current focused electron beam that is scanned over a device surface of the IC to generate a charge-induced voltage alteration (CIVA) signal at the location of any open-circuit defects. The low-energy CIVA signal may be used to generate an image of the IC showing the location of any open-circuit defects. A low electron beam energy is used to prevent electrical breakdown in any passivation layers in the IC and to minimize radiation damage to the IC. The invention has uses for IC failure analysis, for production-line inspection of ICs, and for qualification of ICs.

24 Claims, 4 Drawing Sheets

"PRIOR ART"

INTEGRATED CIRCUIT FAILURE ANALYSIS BY LOW-ENERGY CHARGE-INDUCED VOLTAGE ALTERATION

This invention was made with Government support under Contract No. DE-AC04-94AL85000 awarded by the U.S. Department of Energy. The Government has certain rights in the invention.

FIELD OF THE INVENTION

The present invention relates to the use of scanning electron microscopes for failure analysis of integrated circuits (ICs), and in particular to the detection, location, and mapping of open-circuit electrical conductors in an IC by scanning a low-energy high-current focused electron beam over the IC to generate a charge-induced voltage alteration signal at the location of any open-circuit defects.

BACKGROUND OF THE INVENTION

Failure analysis methods or techniques are essential for developing, manufacturing, and qualifying ICs. These methods for locating and identifying defective portions of an IC can provide insight to manufacturing and processing defects and other device failure modes that must be corrected to improve the yield and reliability of ICs. One example of a manufacturing and processing defect that failure analysis methods may be applied to is open-circuit electrical conductors on ICs. Open-circuit electrical conductors may be defined as an electrically conducting pathway or means whose ability to transfer electrical signals from one part of the IC to another part of the IC has been compromised by one or more failure mechanisms. Examples of mechanisms that can produce open-circuit electrical conductors include stress voiding, electromigration, silicon migration in contact metallization, and design and processing defects. The large effort in the IC industry to understand the mechanisms by which open-circuit electrical conductors are produced is indicative of the serious and ubiquitous nature of this potential problem. In addition, the detection and localization of open-circuit electrical conductors in ICs becomes increasingly difficult as each succeeding generation of ICs becomes more complex with reduced feature sizes, reduced conductor line widths, and an increased number of interconnecting layers. As a result, there is a continuing need for the development of new and improved IC failure analysis methods and apparatus.

Many active and passive methods for IC failure analysis exist in the prior art as disclosed in the articles entitled, "IC Failure Analysis: Techniques and Tools for Quality and Reliability Improvement," by J. M. Soden and R. E. Anderson, *Proceedings of the IEEE*, Vol. 81, May 1993, pp. 703–715 and "Advanced Scanning Electron Microscopy Methods and Applications to Integrated Circuit Failure Analysis," by E. I. Cole, C. R. Bagnell Jr., B. G. Davies, A. M. Neacsu, W. V. Oxford, and R. H. Propst, *Scanning Microscopy*, Vol 2, No. 1, 1988, pp. 133–150.

Among the types of active methods for IC failure analysis are those that measure the response of the IC to an applied stimulus in the form of an electron beam. These active electron beam methods are preferably practiced with the use of a scanning electron microscope (SEM). The SEM provides a focused electron beam and means for scanning the electron beam over a portion of the IC. The SEM also allows the viewing of an image of the IC device structure by means of secondary electron emission. This image of the IC device structure may be combined with the image produced by the active methods above to aid in registering the locations of any defects in the IC. Examples of prior art active electron beam methods for IC failure analysis include capacitive coupling voltage contrast (CCVC), electron beam induced current (EB IC), biased resistive contrast imaging (BRCI), and charge-induced voltage alteration (CIVA).

The CCVC method is disclosed in an article entitled "Electron Beam Testing of Passivated Devices via Capacitive Coupling Voltage Contrast," by W. Reiners, K. D. Herrmann, and E. Kubalek, Scanning Microscopy, Vol. 2, No. 1, 1988, pp. 161–175. The CCVC method uses a changing voltage applied to a buried electrical conductor in the IC to produce a change in the secondary electron emission of an incident low-energy electron beam on the device surface of the IC. Since in the CCVC method, the primary electron beam does not need to penetrate through a passivation layer on the IC, a low electron beam energy may be used. The CCVC signal is the secondary electron emission from the IC device surface; and an analysis image is formed by measuring the spatial variation of this secondary electron emission signal over IC device surface. A limitation of the CCVC method is that secondary electron emission also occurs in the absence of any voltage applied to the IC; and thus the CCVC image includes features of the IC, resulting in a composite image that may complicate the search for defects in the IC. A further limitation of the CCVC method is that surface charging may prevent secondary electron emission from escaping the IC device surface, and this can degrade and obscure the CCVC image. Attempts have been made to overcome this surface charging limitation by recording the CCVC image very rapidly before the device surface charges to an extent that obscures the CCVC signal. However, this complicates the analysis method by requiring the use of high-speed image recording and processing apparatus. The CCVC method is applicable to measuring the logic levels of ICs and the voltage on internal test nodes of an IC.

The EBIC method is used to identify defects in the device layer of an IC by generating an electron-hole current in semiconductor junctions in the IC. A disadvantage of the EBIC method is that for ICs having a passivation layer, the primary electron beam must have sufficient energy to penetrate through the passivation layer to reach the semiconductor device layer in the IC. This electrical breakdown of the IC passivation layer requires a high-energy electron beam energy of up to 5,000 electron volts (eV) or more; and this high electron beam energy can result in radiation damage in metal-oxide-semiconductor (MOS) ICs.

The BRCI method generates a relative resistance map of the conductors on ICs by using the IC as a complex current divider. This method for the measurement of IC logic levels and conductor voltage levels in an IC is disclosed in a paper entitled "A New Technique for Imaging the Logic State of Passivated Conductors: Biased Resistive Contrast Imaging," by E. I. Cole Jr., presented at the 1990 International Reliability Physics Symposium, New Orleans, La., Mar. 27–29, 1990. The BRCI image is generated by monitoring small fluctuations in the power supply current of an IC as an electron beam is scanned over the IC device surface. A disadvantage of the BRCI method is that the electron beam energy is comparable to that of the EBIC method and can also produce radiation damage in MOS ICs.

A CIVA method employing a high-energy primary electron beam for analyzing open-circuit electrical conductors in passivated ICs (i.e. ICs having one or more passivation layers) is disclosed in a paper entitled "Rapid Localization of IC Open Conductors Using Charge-Induced Voltage Alteration," by E. I. Cole Jr. and R. E. Anderson presented at the 1992 International Reliability Physics Symposium, San Diego, Calif., Mar. 30–Apr. 2, 1992. The prior art CIVA method provides a fast, simple method for locating open-circuit electrical conductors, contact, and via defects in ICs that have been very difficult to identify with other analysis methods. The CIVA image is generated by monitoring the voltage shifts in a constant-current power supply as a high-energy (about 5,000 eV or more for a passivated IC) electron beam is scanned over a biased IC. As electrons from the high-energy electron beam are injected into nonfailing electrical conductors in the IC, the additional current, on the order of nanoamperes, is readily absorbed by the IC conductors (i.e. this additional current is conducted to other regions of the IC) and produces little change in the power supply voltage. However, when electrons from the high-energy electron beam are injected into an electrically floating (i.e. open-circuit) conductor, the voltage of the conductor becomes more negative. This abrupt change in voltage on the floating conductor due to exposure to the high-energy electron beam generates a temporary change in the voltage demand of the constant-current power supply that is biasing the IC. The temporary change in the power supply voltage, even for open-circuits with significant quantum mechanical tunneling current, may be about 100 millivolts or larger for a power supply voltage of about 5 volts.

The CIVA apparatus and method for IC failure analysis were developed to localize open-circuit electrical conductors on both passivated and depassivated ICs. An advantage of the CIVA method over the other active methods above is that the CIVA images are generated only from the electrically open circuit portion of a conductor; whereas many of the other methods including CCVC, EBIC, and BRCI show contrast variations due to features of the IC other than an electrically open-circuit electrical conductor. Thus a CIVA image may be initially generated showing only open-circuit electrical conductors in an IC. Then the CIVA apparatus may be adjusted to produce a CIVA image in combination with a secondary electron emission image of the same portion of the IC (generated by scanning the same electron beam either simultaneously with or separate from the CIVA image scan), and these images may be combined to form a composite image to further localize the defect within the IC.

Another advantage of the CIVA method is that it is capable of detecting open-circuit electrical conductors in which the open circuit is due to quantum mechanical electron tunneling. Such types of open circuits may arise from electromigration or stress voiding; and they are very difficult to detect by other failure analysis methods. Another advantage of the CIVA method is that it has a high selectivity that allows any open-circuit electrical interconnections on an entire IC to be identified and mapped in a single image.

A disadvantage of the prior art CIVA method is that the primary electron beam must have sufficient energy to penetrate through any passivation layers in the IC to the underlying open-circuit electrical conductors in order to generate a CIVA voltage signal. In the case of ICs having one or more passivation layers, this requirement necessitates the use of a primary electron beam with an energy sufficiently high to produce an electrical breakdown of the passivation layer and generate a conducting channel to the buried electrical conductors in the IC. This high electron beam energy of 5,000 to 10,000 electron volts or higher is disadvantageous since it results in radiation damage to the IC similar to that of other prior art high-energy electron beam analysis methods. Such radiation damage severely restricts the application of the prior art CIVA method and limits its use in IC production lines or for qualification of ICs.

It should be noted that in the case of unpassivated or depassivated ICs, there is no insulating passivation layer barrier to prevent the primary electron beam from reaching the open-circuit electrical conductors of the IC and hence a very low electron beam energy of, for example, 300 eV may be used to obtain a signal with the prior an CIVA method. In the practice and use of the prior an CIVA method, there was no teaching or suggestion that such low electron beam energies could be used for passivated ICs. For passivated ICs, it was instead taught that use of the prior art CIVA method required a primary electron beam having sufficient energy to cause an electrical breakdown in the passivation layers of the IC. The use of a low electron beam energy is known to be preferable to reduce the occurrence of radiation damage to the IC; but heretofore such a low energy beam was only known to be usable for unpassivated or depassivated ICs.

However, since ICs are preferably fabricated with at least one insulating passivating layer such as silicon dioxide or silicon nitride overlying the patterned electrical conductor and device layers, the use of a low electron beam energy with the prior art CIVA method required that the passivation layer by removed by etching or by other methods. This is disadvantageous for many reasons. Removing the passivation layer is time consuming. It may alter or otherwise affect other features of the IC. It may result in the generation of electrical shortcircuits in regions of overlapping electrical conductor layers. It may generate additional types of defects that may obscure or complicate the search for the original defects in the IC. And finally, it cannot be used on a production line where the goal is to perform failure analysis on completely processed IC die immediately prior to encapsulation to locate defective ICs while not damaging or otherwise affecting non-damaged ICs. Such depassivating methods are also unacceptable for inspection or qualification of completely processed IC die prior to incorporation into a multi-chip module or other type of package that may be assembled by a manufacturer or user of ICs.

Therefore, in the prior-an CIVA method, the preferred method of usage heretofore has been to leave the passivation layer intact and to increase the primary electron beam energy until an electrical breakdown of the insulating dielectric passivation layer occurs. This electrical breakdown allows the electron beam to penetrate from the device surface to the open-circuit electrical conductors of the IC forming a conducting channel and allowing the generation of a CIVA voltage signal. This high-energy method of usage of the prior art CIVA method (designated herein as high-energy CIVA) was known to result in some radiation damage to the IC; but no other method of usage was known heretofore for analysis of passivated ICs using the CIVA method. As a result, the prior-art high-energy CIVA apparatus and method has been heretofore limited primarily to failure analysis of defective passivated ICs with no possibility for wide-scale production line usage or for qualification.

Electron beam induced damage to passivated MOS ICs is discussed in an article entitled "Electron Beam Induced Damage on Passivated Metal Oxide Semiconductor Devices," by S. Gorlich and E. Kubalek, *Scanning Electron Microscopy*, Vol. I, 1985, pp. 87–95. Electron beam induced damage to ICs is more severe for MOS ICs than for bipolar ICs due to a penetration of the primary electrons into the deep-lying gate oxide. Studies of the influence of non-penetrating electron irradiation on the characteristics of passivated NMOS transistors, for example, show that significant damage can occur even when the primary electrons do not penetrate to the gate oxide. This damage is due to secondary x-rays generated by the primary electrons in the passivation layer of the IC, since these x-rays penetrate into the gate oxide. The primary damage mechanism in the gate oxide is the generation of electronhole pairs and the subsequent trapping of positive holes that then causes a change in the space charge. This change in the space charge results in a shift in the threshold voltage, $V_{th}$, of the transistor. (The threshold voltage is defined as the transistor gate voltage required to generate a specified drain-to-source current at a specified drain-to-source voltage.) Furthermore, interface states at the gate oxide boundary may be affected. Both effects are responsible for altering the device parameters.

The severity of the radiation damage increases with the irradiation dosage (i.e. the time that a portion of the IC is exposed to an electron beam), with the primary electron beam energy, and with decreasing size of the gates of the transistors in the IC. Studies as reported in the above article by Gorlich et al for n-channel MOS transistors show that the same shift of the threshold voltage caused by irradiation using 10,000 eV electrons, is found at about 20 times higher doses of 5,000 eV electrons and 10,000 times higher doses of 1,000 eV electrons. And, since the severity of the radiation damage increases with a decreasing size of the gates of the transistors in the IC, the threshold voltage shift may be even larger for current and future generations of ICs with 1 micron or smaller gate sizes unless improved gate oxide materials with fewer intrinsic defect sites are developed to improve the radiation hardness. Thus, there is a substantial benefit and advantage to be gained by reducing the primary electron beam energy to about 1,000 eV or less since the radiation damage lessens over-proportionally with decreasing energy of the primary electron beam.

In the prior art high-energy CIVA method, it was known to use the lowest primary electron energy possible to build up the necessary conducting channel through the passivation layer to the electrical conductors to minimize the possibility of radiation damage to the IC under test. For typical IC passivation layers, an electron beam energy of greater than or equal to 5,000 eV is generally required to penetrate to the buried electrical conductors; and the electron beam energy must be increased for thicker passivation layers. For example, a 1 micron thick silicon dioxide ($SiO_2$) passivation layer requires an electron beam energy of about 10,000 eV to form a conducting channel through the passivation layer.

In the use of the prior art high-energy CIVA method, primary electron beam energies of about 10,000 eV or more were often required for passivated complimentary metal-oxide-semiconductor (CMOS) ICs. For example, the above CIVA article by Cole Jr. et al discloses several examples of the use of the prior art high-energy CIVA method for passivated CMOS ICs. These examples include the use of a primary electron beam energy of 9,000 eV for a CMOS application-specific integrated circuit (ASIC) having a single metallization (conductor) layer; the use of a primary electron beam energy of 11,000 eV for a second single-level metal IC with a thicker passivation layer; and the use of a primary electron beam energy of 15,000 eV for a two-level metal (i.e. two conductor layer) 1-micron technology CMOS ICs with about 1 micron thick passivation layers. These examples show the high primary electron beam energies required by the prior art high-energy CIVA apparatus and method when used to analyze passivated ICs.

It was further known in the prior art high-energy CIVA method that exposure to the electron beam (i.e. the number of images that were acquired) should be limited to minimize radiation damage as is disclosed in the article by Gorlich et al. In the above CIVA article by Cole Jr. et al, measurements of IC damage due to exposure to a 5,000 eV primary electron beam are reported. These measurements for 3-micron gate n-channel transistors with a nine second per image scan rate show a nearly linear increase in the transistor threshold voltage with the number of images acquired. The threshold voltage shift is about 5% after 11 images are acquired and increases to nearly 50% for 50 images.

Therefore, although the prior art CIVA method has many desirable features and advantages for imaging open-circuit electrical conductors in ICs, its use for passivated ICs has heretofore been limited. What is needed is a CIVA method that operates at a low primary electron beam energy of about 1,000 eV or less. Such a low-energy CIVA method is disclosed in the present patent application.

SUMMARY OF THE INVENTION

Accordingly, it is a primary object of the present invention to provide an apparatus and method for imaging and mapping open-circuit electrical conductors in an IC, including open circuits due to quantum-mechanical tunneling, by means of a low-energy primary electron beam.

Another object of the invention is to provide an apparatus and method for imaging and mapping open-circuit electrical conductors in an IC in which the primary electron beam energy is below that required for electrical breakdown of a passivation layer in the IC.

An additional object of the invention is to provide an apparatus and method for imaging and mapping open-circuit electrical conductors in an IC in which radiation damage to ICs generated by exposure to a primary electron beam is substantially reduced.

Still another object of the invention is to provide an apparatus and method for imaging and mapping open-circuit electrical conductors in an IC in which an identical primary electron beam energy may be used for both passivated and unpassivated ICs with minimal radiation damage.

Another object of the invention is to provide an apparatus and method for imaging and mapping open-circuit electrical conductors in an IC that may be adapted for use with commercial scanning electron microscopes having a primary electron beam energy of about 1,000 eV.

Another object of the invention is to provide an apparatus and method for imaging and mapping open-circuit electrical conductors in an IC that may be adapted for IC production line or qualification use.

Additional objects, advantages, and novel features of the invention will become apparent to those skilled in the art upon examination of the following description or may be learned by practice of the invention. The objects and advantages of the invention may be realized and attained by means of the instrumentalities and combinations particularly pointed out in the appended claims.

To achieve the foregoing and other objects, and in accordance with the purposes of the present invention as described herein, an improved CIVA apparatus and method are provided to detect, locate, and map open-circuit electrical conductors in an IC by scanning a low-energy, high-current electron beam over the IC to generate a rapidly changing electrical potential at the device surface of the IC without any electrical breakdown of any passivation layers of the IC. This rapidly changing electrical potential acts to polarize the passivation layer of the IC and to produce a time-varying bound electrical charge at the interface between the passivation layer and the conductor layer that induces a small voltage pulse on the buried electrical conductor. In open-circuit electrical conductors, this voltage pulse acts to change the voltage of a constant-current power supply powering the IC, thereby generating a CIVA voltage signal that may be amplified and displayed.

In accordance with the invention, a low-energy primary electron beam may be generated by a scanning electron microscope, with the scanning electron microscope also providing means for scanning the electron beam over the device surface of an IC and providing a secondary electron image of the IC for registration of the locations of any defects in the IC.

In accordance with the invention, the use of a low-energy primary electron beam substantially reduces any radiation damage to the ICs being tested and minimizes any shift in the threshold voltage of the IC. This enables the apparatus and method of the invention to be applied to failure analysis in IC production lines to allow failure locations and defects to be pinpointed and reasons for certain yield reductions to be determined. It further enables the apparatus and method of the invention to be applied to the inspection and qualification of ICs received by a purchaser or user of ICs.

Other objects, advantages and novel features of the invention will become apparent from the following detailed description thereof when considered in conjunction with the accompanying drawings wherein:

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating a preferred embodiment of the invention and are not to be construed as limiting the invention. In the drawings.

DETAILED DESCRIPTION OF THE INVENTION

Figure 1:
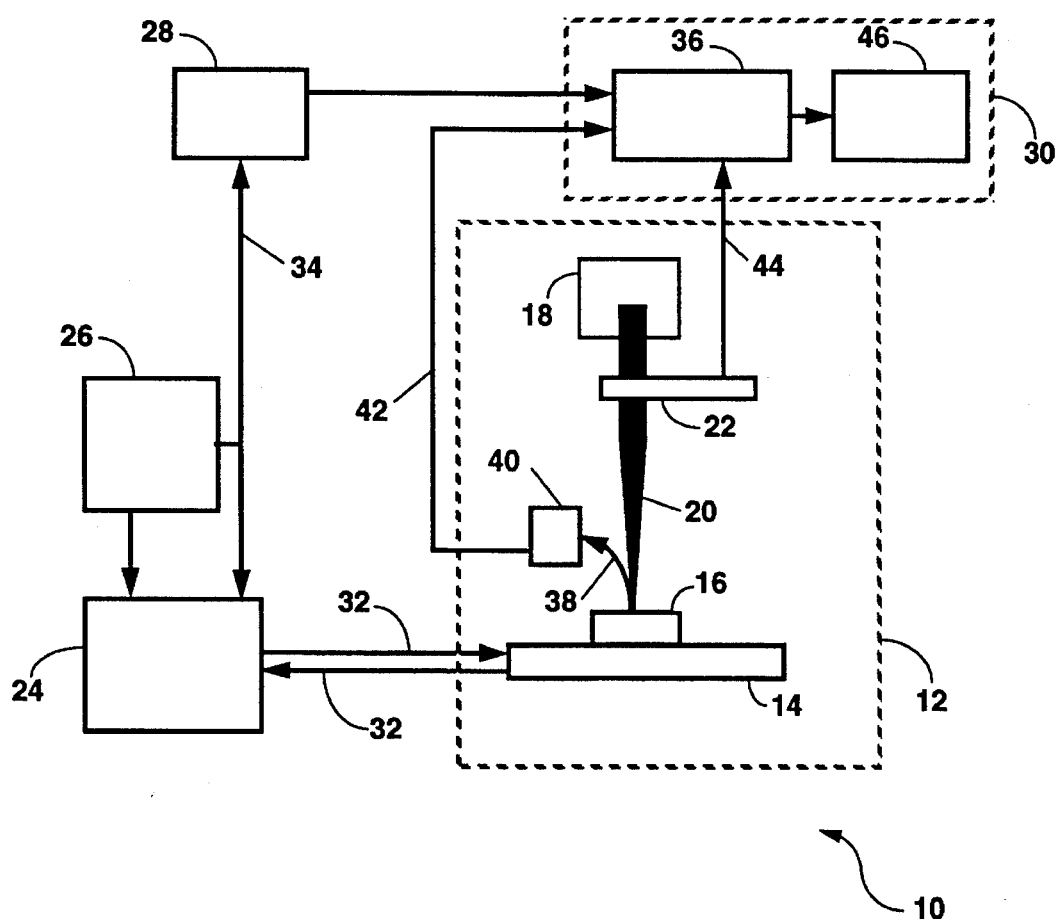
FIG. 1 shows a block diagram for a system in accordance with the invention for identifying and mapping open-circuit electrical conductors in an IC.
Figure 1:
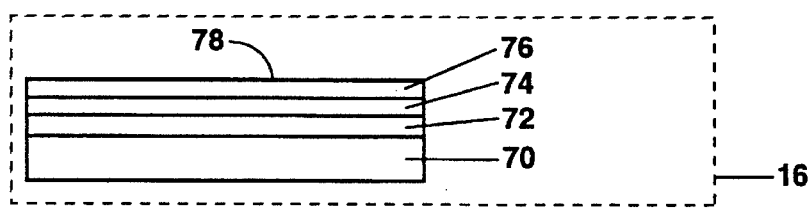

In the low-energy CIVA apparatus and method of the present invention, shown schematically in FIG. 1, images of any open-circuit electrical conductors in an IC are produced by monitoring the voltage fluctuations of a constant-current power supply as a focused electron beam is scanned over the IC device surface. The changing electrical potential on the device surface of the IC acts to produce a time-varying bound electrical charge at the metal conductor-passivation layer interface as the focused electron beam is scanned across the IC; and the induced voltage change in the IC due to this bound charge alters the voltage demands of the IC when a constant-current power supply is used. The changing voltage of the constant-current power supply forms the signal for the low-energy CIVA apparatus and method of the present invention.

In FIG. 1, the low-energy CIVA system 10 of the present invention comprises: a vacuum chamber 12; a stage 14 for holding at least one integrated circuit 16; a low-energy electron beam source 18 producing a focused electron beam 20; an electron beam scanning means 22; a switch matrix 24; a constant-current power supply 26; a voltage amplifier 28; and a display means 30.

FIG. 1 also shows a schematic diagram of an integrated circuit. The integrated circuit 16 consists of a semiconductor substrate 70 upon which are disposed a plurality of layers comprising at least one device layer 72 upon which at least one patterned conductor layer 74 is deposited. For passivation purposes, at least one passivation layer 76 is preferably deposited over the conductor and device layers. Multiple overlapping conductor layers may be separated and electrically insulated by additional passivation layers termed inter-level dielectric layers. The passivation layer thickness may vary from about 0.5 to 1 micron in most ICs. The passivation layer may be either undoped or lightly doped, with the light doping acting to prevent the buildup of a permanent surface charge that may affect device operation and reliability. The outer surface 78 of the IC in FIG. 1 opposite the semiconductor substrate is termed the device surface; and this is the surface of interest for electron beam analysis of the IC. This device surface 78 is the upper surface of the final passivation layer in the case of a passivated IC; and it is the upper surface of the conductor or device layer or both in the case of an unpassivated or depassivated IC.

The low-energy CIVA apparatus in FIG. 1 preferably comprises a scanning electron microscope (SEM). The scanning electron microscope (SEM) may comprise the vacuum chamber 12, stage 14, the low-energy electron beam source 18, and the electron beam scanning means 22 in FIG. 1. The SEM may also comprise additional elements including electrical feedthroughs for conveying a plurality of electrical signals into and out of the vacuum chamber, and means for detecting a secondary electron image of the IC.

For use of the CIVA apparatus and method, at least one IC 16 is placed into the vacuum analysis chamber 12 on the stage 14 that includes means for making electrical connections 32 to the IC. The IC 16 may be in many different forms including but not limited to a wafer form comprising a plurality of ICs on a semiconductor wafer; a die form comprised of a single IC separated from the semiconductor wafer for later mounting in a package or module or other vehicle; and a packaged form comprised of one or more die affixed to a carrier or heatsink. For analysis of a completely packaged IC, the IC lid may be removed by methods as known to the art to expose the device surface of the IC for electron beam access.

Electrical connections 32 to each of the various forms of ICs may be made by the use of electrical probes, chip carriers, sockets, or other means as commonly used by those skilled in the art. Electrical power for the IC is provided by a power supply 26. The power supply 26 is preferably routed through a switch matrix 24 as shown in FIG. 1 to allow the electrical connections 32 (including logic signals) to and from the IC to be controlled and reconfigured by a manual or computer-controlled switching apparatus, by a digital tester, or by other means for testing, configuring, or altering IC inputs.

The power supply 26 in FIG. 1 may be a constant-current/ constant-voltage supply as, for example, a Keithley Instruments Model 236 source/measurement supply that may be operated either in a constant-current mode or a constant-voltage mode. The CIVA measurement is preferably made with the power supply 26 operated in the constant-current mode. The variation in the power supply voltage in response to the focused electron beam 20 as the electron beam 20 is scanned over an open-circuit electrical conductor in the IC 16 forms the CIVA voltage signal 34. This CIVA voltage signal may be further separated into its alternating-current (ac) or direct-current (dc) components, with these ac and dc signals amplified by a voltage amplifier 28 prior to display. The voltage amplifier 28 may be either ac or dc coupled. If a voltage amplifier is used (for example, an Ithaco Model 1201 amplifier), the amplifier gain and frequency bandpass filters (high and low pass filters for an ac-coupled amplifier) may be used to act upon the CIVA voltage signal 34 to improve an aspect (for example, the visibility or resolution) of a displayed CIVA image. The exact gain and other parameters to be used for the voltage amplifier 28 will vary depending on the nature of the CIVA voltage signal which may in turn depend on the particular IC type and structure that is being analyzed including, for example, the thickness of the IC passivation layer. The ac component of the CIVA signal is preferable for detecting and imaging "complete" open-circuit electrical conductors (i.e. those in which no quantum mechanical tunneling occurs) as well as for quantum-mechanical-type open-circuit electrical conductors.

The display means 30 of the CIVA apparatus in FIG. 1 may comprise an image processing means 36 for combining a secondary electron image with the CIVA image of any open-circuit portions of the IC to aid in locating or mapping the defects. The secondary electron image is generated from the secondary electrons 38 that are emitted from the IC under the influence of an incident primary electron beam. These secondary electrons 38 are detected with a secondary electron detector 40 that produces a secondary electron signal 42 which is transmitted to the image processing means 36. The image processing means 36 may further act to add, subtract, enhance, digitize, store, or otherwise affect the secondary electron and CIVA signals. The image processing means 36 preferably generates a composite video output signal containing the position signal 44 from the electron beam scanning means 22 to allow the images to be displayed on a television monitor 46 or recorded electronically. The display means 30 may be a part of an existing scanning electron microscope; or it may be a separate instrument.

Figure 2:
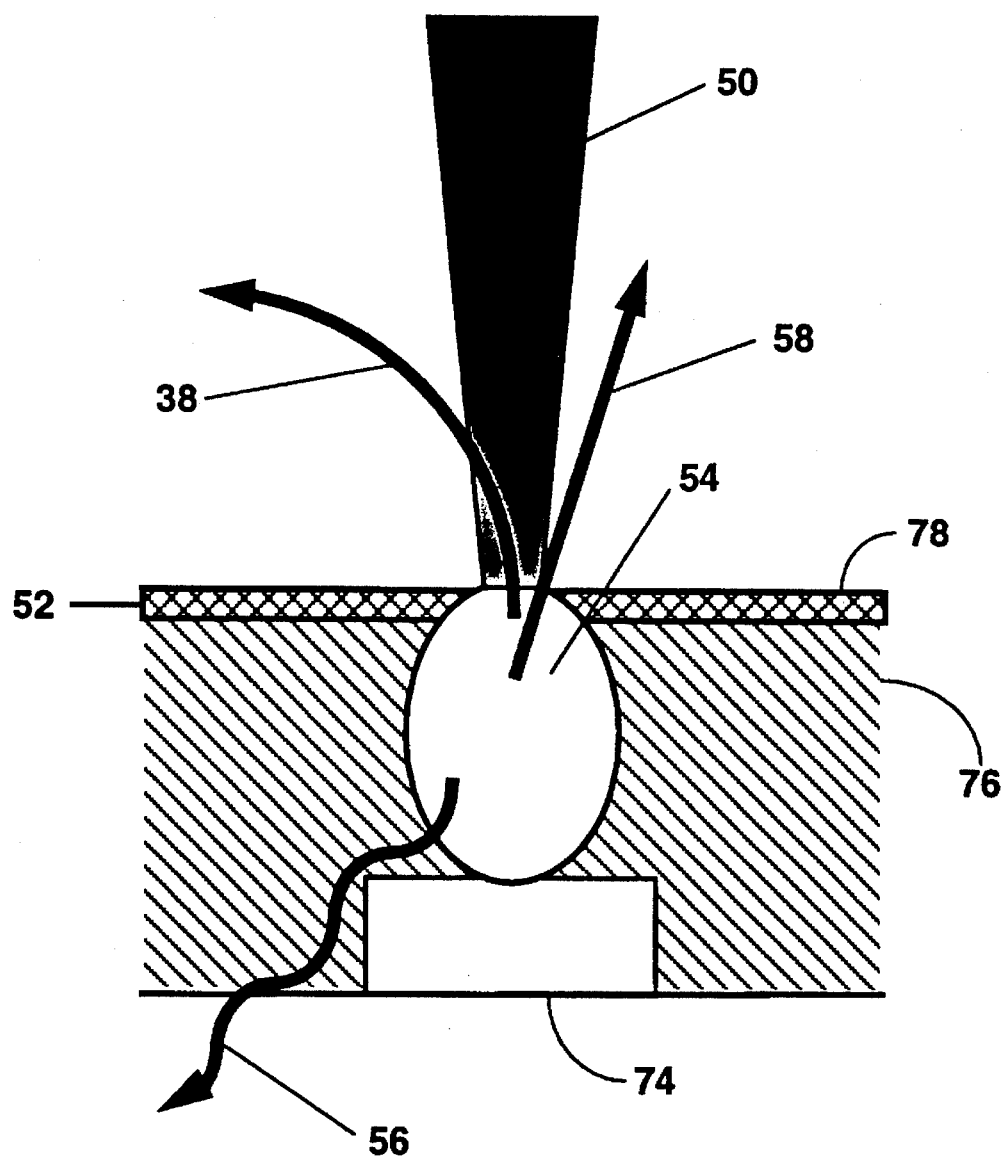
FIG. 2 shows a schematic representation of the prior art high-energy CIVA method.

The prior art high-energy CIVA method may be understood with reference to FIG. 2. A discussion of this prior art high-energy CIVA method will aid in distinguishing it from the low-energy CIVA method of the present invention. This discussion is necessary since the CIVA apparatus in FIG. 1 has many common elements for the two types of CIVA, although the mode of operation of the electron beam (i.e. the current and energy) and the physical mechanism responsible for generating the CIVA signal are completely different for the prior art high-energy CIVA method and the low-energy CIVA method of the present invention. FIG. 2 shows a portion of the IC 16 of FIG. 1 comprising the passivation 76 and patterned conductor 74 layers and the device surface 78. In FIG. 2, a focused high-energy primary electron beam 50 of, for example, 10,000 eV is shown incident on the device surface of an IC having a 1 micron thick silicon dioxide ($SiO_2$) passivation layer. The high-energy primary electron beam 50 generates secondary electrons 38 from a secondary electron region 52. The high-energy primary electron beam 50 further generates an interaction volume 54 that penetrates down to the conductor layer 74 of the IC resulting in the formation of a conducting channel in the interaction volume 54 from the device surface 78 to the buried electrical conductor 74. Such a high-energy primary electron beam also generates additional secondary interaction products including secondary x-rays 56 and backscattered electrons 58. As mentioned previously, these secondary x-rays 56 are detrimental to the operation of the IC, resulting in radiation damage to the IC that changes the threshold voltage of the IC transistors. This induced damage limits the use of the prior-art high-energy CIVA method and apparatus for many applications including production line and qualification use.

In the prior-art high-energy CIVA method, the minimum electron beam energy required for electrical breakdown of the passivation layer 76 to establish a conduction channel is determined by initially biasing the IC with a constant-voltage power supply and monitoring the electrical current being supplied to the IC from the constant-voltage power supply. An electron beam 50 with a high energy of, for example, about 5,000 eV is then scanned over the entire device surface of the IC, and the electron beam energy is gradually increased until electrical breakdown of the insulating passivation layer 76 occurs. When the electron beam energy is sufficiently high to produce an electrical breakdown of the insulating passivation layer with an interaction volume 54 reaching to the buried electrical conductor 74 of the IC, the electrical current supplied to the IC from the constant-voltage power supply decreases. After the determination of an electron beam energy sufficient for the interaction volume 54 to form a conducting channel through the passivation layer to the buried electrical conductor 74, the power supply is switched to constant-current operation and the electrical current and the compliance voltage to the IC are set at the normal operating values for the IC. This current is, for example, several microamperes or less for a fully static CMOS IC and the compliance voltage is preferably about 5 volts. The high-energy CIVA signal is then generated by monitoring the voltage shifts in the constant-current power supply as the high-energy electron beam 50 is scanned over the device surface 78 of the biased IC.

Figure 3:
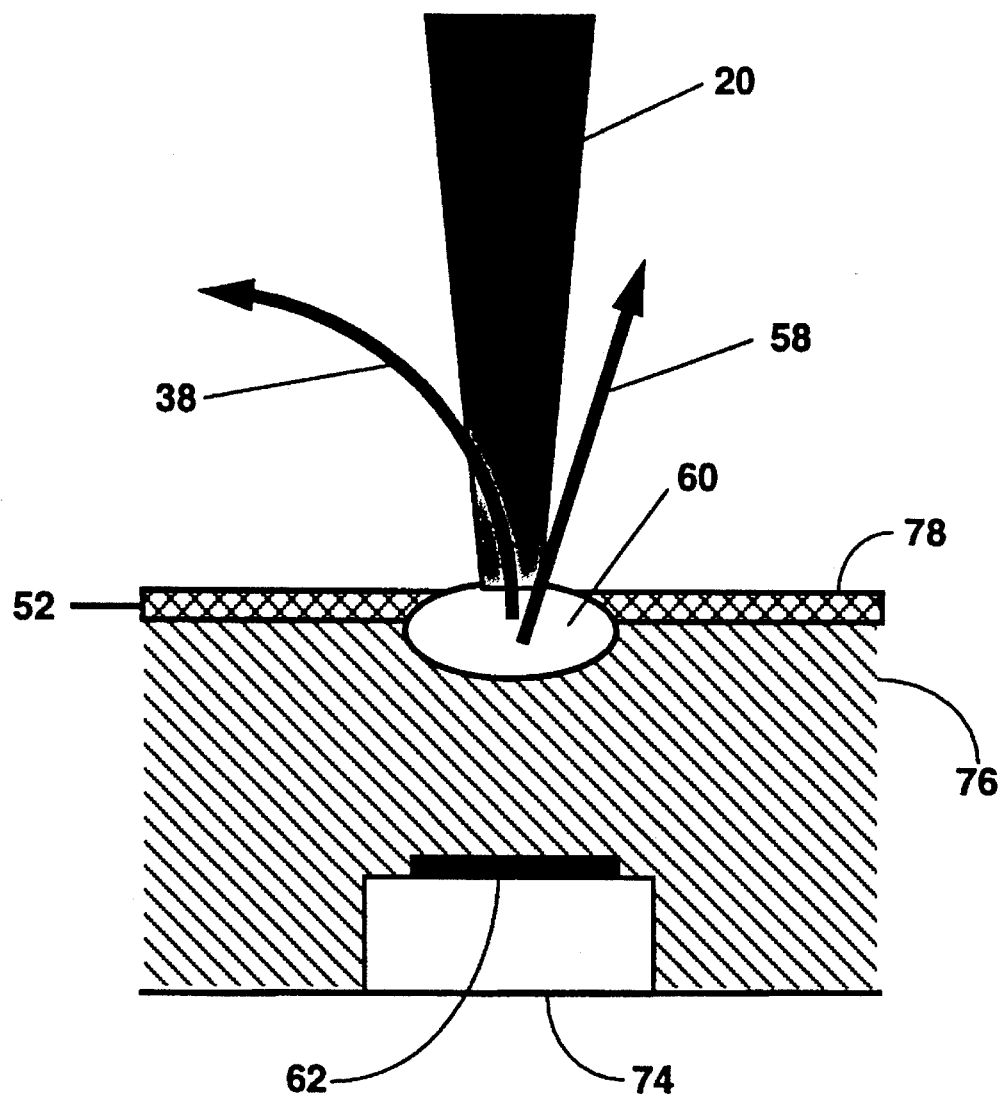
FIG. 3 shows a schematic representation of the low-energy CIVA method of the present invention.

The method of the present patent disclosure, although termed low-energy CIVA, operates in a completely different mode than the prior art high-energy CIVA method in FIG. 2; and the physical mechanism responsible for generating the low-energy CIVA signal is completely different. The apparatus for low-energy CIVA is as shown in FIG. 1, with the energy of the focused primary electron beam 20 preferably being sufficiently low to prevent any electrical breakdown of the IC passivation layer 76. The low-energy CIVA method of the present invention may be further understood with the aid of FIG. 3 which shows an IC structure similar to that in FIG. 2. In FIG. 3, the low-energy (about 1,000 eV or less) electron beam 20 incident on the device surface 78 of the IC 16 generates a distinctly different interaction volume 60 characterized by a limited extent of penetration only part way through the passivation layer 76 with no direct contact with the conductor layer 74. The limited penetration extent of the low-energy CIVA interaction volume 60 prevents the occurrence of any electrical breakdown of the passivation layer 76 and the formation of any conducting channel to the buried electrical conductor layer 74.

The primary effect of exposure of the IC 16 to the incident electron beam 20 in the low-energy CIVA method of the present invention is to initially produce a positive electrical potential on the device surface 78 of the IC. In the prior art, it has been generally assumed and taught that the equilibrium value of this positive electrical potential is independent of the electron beam current or flux. It has further been generally assumed and taught that the only effect of the electron beam current is to determine the time required to reach an equilibrium value of the electrical potential due to surface charging. However, contrary to this widely accepted knowledge and teaching about surface charging in the presence of an electron beam, recent experimental work first known to be revealed by the present invention teaches that with exposure to the incident primary electron beam 20 having a low energy of about 1,000 eV and a high beam current of about 20 to 25 nanoamperes (up to 100 times higher beam current than may normally be used for SEMs), the electrical potential on the device surface 78 that is initially positively charged will in a few microseconds reverse its polarity and become negatively charged as an equilibrium potential is reached. Thus, for example, a device surface 78 that is initially uncharged (i.e. at zero volts of electrical potential) upon exposure to an incident low-energy high-current electron beam will initially acquire a positive electrical potential on the device surface as is commonly taught for low-energy (about 1,000 eV) SEM imaging of passivated ICs. After this initial positive value of the electrical potential is reached, it is now thought according to the teaching of the present invention that the incident low-energy high-current electron beam 20 that penetrates only a very short distance (less than 25 nanometers) into the passivation layer 76 acts to deplete the number of available secondary electrons 38 that can escape from the device surface 78, and the device surface electrical potential reverses polarity as it becomes negatively charged with continued exposure to the primary electron beam 20. This change in the polarity of the surface charge with exposure to the incident low-energy high-current electron beam forms a basis for the low-energy CIVA method of the present invention.

The rapidly changing electrical potential at the device surface 78 due to an incident low-energy high-current electron beam 20 acts to polarize the passivation layer 76 and to produce a time-varying bound electrical charge 62 at the interface between the passivation layer 76 and the conductor layer 74. This induced bound charge effect is inversely proportional to the thickness of the overlying passivation layer 76. This time-varying bound electrical charge 62 further acts to induce a small voltage pulse on the buried electrical conductor 74. This small voltage pulse is readily absorbed or dissipated in non-failing electrical conductors by conduction to other regions of the IC. However, in open-circuit or floating electrical conductors, this voltage pulse can act to change the voltage of a constant-current power supply 26 powering the IC 16 and thereby generate a CIVA voltage signal 34 that may be amplified by a voltage amplifier 28 and displayed by a display means 30. (Intervening non-failing electrical conductors disposed above an open-circuit electrical conductor may act to prevent the induced bound charge effect from reaching the open-circuit electrical conductor since the intervening non-failing electrical conductors may absorb and dissipate the bound charge and the induced voltage pulse.)

Increasing the energy of the incident primary electron beam 20 in FIG. 3 increases the penetration depth of the interaction volume 60 and allows the induced bound charge effect to penetrate further into the IC passivation layer 76. If the energy of the incident primary electron beam 20 becomes too large, however, the effect of charging the device surface first positively and then negatively will diminish. The primary electron beam energy at which this occurs depends on the passivation layer type; but for the ICs studied to date, it occurs at a primary electron beam energy of about 2,500 eV (about 0.1 micron penetration of the primary electron beam 20 into the passivation layer 76). The preferred primary electron beam energy for the low-energy CIVA apparatus and method is about 300 eV, although very similar results have been obtained with the primary electron beam energy in the range of about 300 to about 1,000 eV.

The low-energy CIVA image may be improved by operating the IC 16 with an ac input signal (i.e. changing an input signal 32 to the IC at a clock rate or running a test logic routine to alter the logic states in the IC over a short period of time). This ac operation of the IC acts to deplete the bound charge 62 on the IC conductor layer 74; and it also increases the probability of detecting an open-circuit electrical conductor by increasing the chances that the open-circuit conductor will be placed in a logic state susceptible to CIVA observation. For example, if an electrical conductor 74 is an open circuit due to a stress void that has significant charge tunneling across the metal void, that conductor will acquire a "low" voltage due to charge tunneling when it is driven to a "low" logic state. The negative bound charged induced in this same open-circuit electrical conductor will further reduce its voltage; but since it is already in a "low" logic state, this will have very little if any effect on the IC power requirements and hence no measurable CIVA signal 34 will be generated. On the other hand, if this open-circuit electrical conductor is driven to a "high" voltage across the tunneling stress void, the negative bound charge 62 induced by the electron beam 20 on the open-circuit portion of the electrical conductor 74 will lower the voltage from the "high" logic state and this can significantly change the IC power requirements and thereby generate a CIVA signal 34. AC operation of the IC during testing increases the probability that a given electrical conductor 74 will be driven to a "high" logic state and therefore be susceptible to the low-energy CIVA effect. This ac mode of operation may be performed, for example, on a commercial electron beam test system that is normally configured for ac analysis of an IC.

Since electrical breakdown is not required or desirable for the low-energy CIVA method and apparatus, there is no need for a control or adjustment of the primary electron beam energy as required for the prior art high-energy CIVA method (although such control may be available depending of the particular SEM used to practice the invention). The use of a fixed primary electron beam energy of about 1,000 eV makes low-energy CIVA applicable for use with the majority of commercial electron beam test systems. These commercial electron beam test systems are systems that have been designed primarily to perform voltage contrast imaging of ICs. They generally have a fixed electron beam energy of about 1,000 eV, but some have variable energies of about 500 to about 1,500 eV. Only phenomena on or near the device surface have been heretofore observable at these low primary electron beam energies. Indeed, the primary electron beam energies have been limited to this energy range of about 500 to about 1,500 eV to prevent electron beam irradiation damage to the ICs being examined, and also to simplify the electron optics required for the electron beam test system. Low-energy CIVA analysis with the present invention requires a high electron beam current of preferably about 20 to 25 nanoamperes as compared with the low electron beam current (about 0.2 nanoamperes) for normal SEM analysis. To attain such high electron beam current, it may be necessary to modify commercial electron beam test systems or SEMs by modifying an aspect of the electron beam source 18 as, for example, increasing the electron beam aperture size or reducing the condenser lens voltage, or both.

In the prior art high-energy CIVA method, any charge on the device surface 78 was dissipated through the conducting channel (formed by the interaction volume 54) to the electrical conductor layer 74, the device layer 72, and the semiconductor substrate 70. Some surface charging in the prior art high-energy CIVA method may have been present on portions of the IC due to the passivation layer 76 being thicker than it is over the electrical conductors; but the prior art high-energy CIVA signal in no way depended on this surface charging nor was the prior art high-energy CIVA signal affected by the surface charging.

Figure 4:
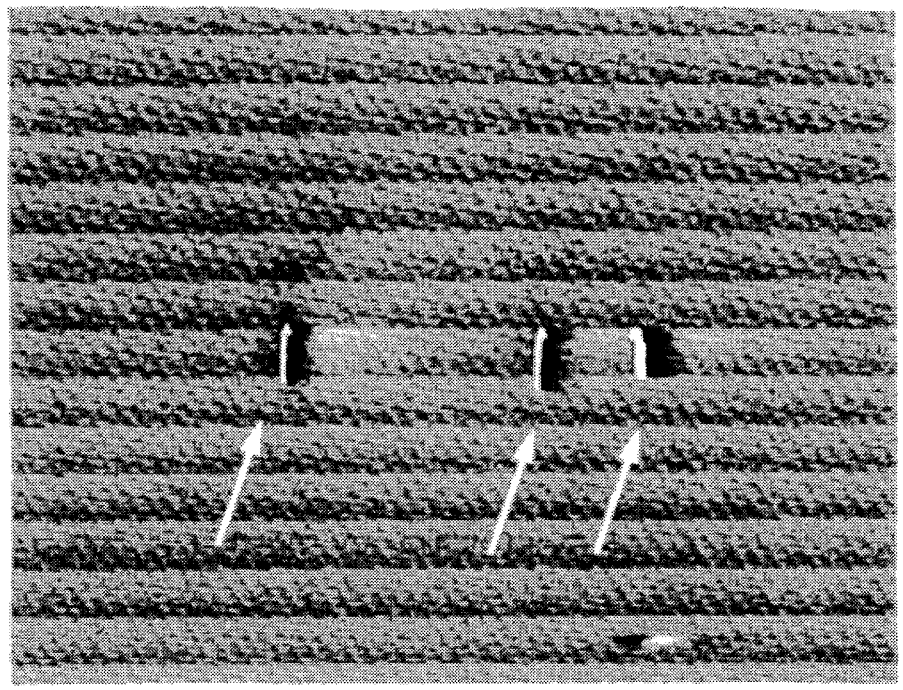
FIG. 4 shows a low-energy CIVA image of a CMOS IC obtained with the present invention showing the locations of open-circuit electrical conductors in the IC.

FIG. 4 shows a low-energy CIVA image of three open-circuit electrical conductors in a passivated CMOS IC having a single level of metallization (i.e. a single electrical conductor layer 74). This image was acquired using a primary electron beam with only 300 eV energy. Such clear and distinct images at this low primary electron beam energy have only heretofore been obtainable by the prior-art high-energy CIVA method for unpassivated or depassivated ICs. FIG. 4 also shows a complete absence of any detail other than the low-energy CIVA images of the open-circuit electrical conductors. This is an advantage of both types of the CIVA method when compared with other prior art failure analysis methods that generate a large amount of superfluous information. In these other prior art methods, there is little difference in the image contrast level (black to white) for a failing versus a non-failing portion of an electrical conductor. Therefore, with these other prior art methods, it is extremely difficult to locate a defect especially when viewing the entire IC die due to the lack of adequate contrast in the image between the failing and non-failing portions of the IC. About the only information in a CIVA image, however, is the open-circuit electrical conductors, with very little or no contrast due to other features of the IC. This is why an entire IC die can be examined in a single image with the CIVA method; and then the failure can be localized more closely by increasing the magnification or combined with a secondary electron image of the IC for registration and location of the defect site in the IC.

Figure 5:
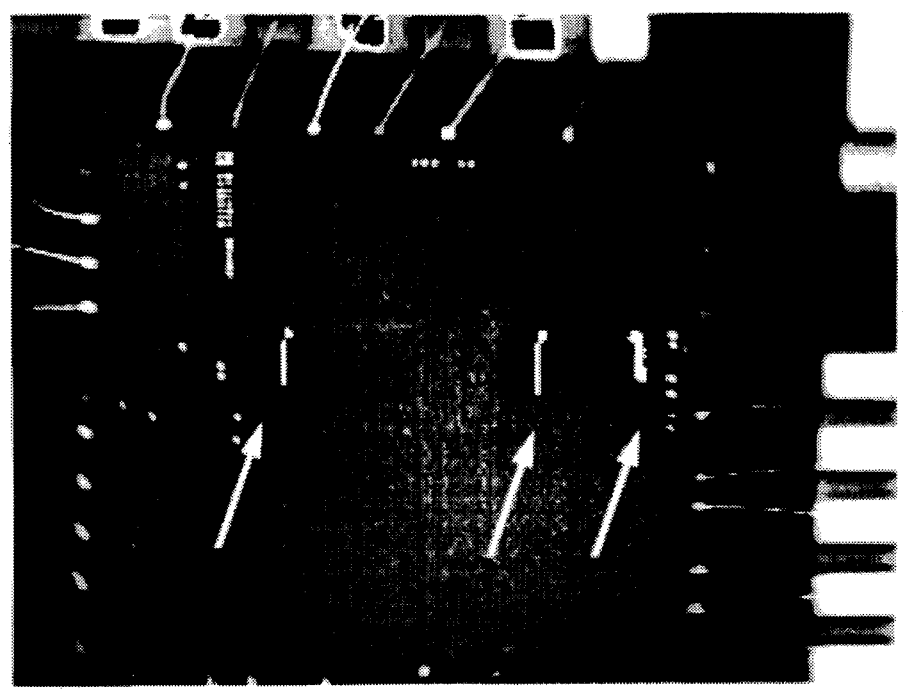
FIG. 5 shows a low-energy CIVA image of the CMOS IC obtained with the present invention as combined with a secondary electron image of the IC for registration.

In FIG. 5, the low-energy CIVA image of FIG. 4 has been combined with a secondary electron image of the IC by the display means image processor 36 for registration purposes. This ability to view the CIVA image alone or to combine it with a secondary electron image of an IC is a further advantage of the CIVA method and it allows the rapid localization and identification of open-circuit defects in the IC.

Low-energy CIVA as disclosed is capable of imaging open-circuit electrical conductors for ICs fabricated with standard technologies with a single patterned conductor layer 74 (i.e. a single level metal interconnect). For multiple conductor layers 74 (i.e. multiple levels of metal interconnects), the higher lying non-failing electrical conductors above any open-circuit electrical conductors may absorb and dissipate the bound charge of interest and prevent an observation of any lower lying open-circuit electrical conductors. Thus, for example, it has been possible with the low-energy CIVA method to image open-circuit electrical conductors in the metal-2 conductor layer (i.e. the second metal conductor layer 74 above the device layer 72) in an IC having three metal conductor layers. However, in the same IC it was not possible to image the metal-1 conductor layer below those same open-circuit electrical conductors in the metal-2 conductor layer. Furthermore, even if no intervening electrical conductor layer obscures the bound charge, a sufficient thickness of dielectric material in multiple passivation layers 76 (including interlevel dielectric layers) can reduce the low-energy CIVA signal 34, so that it becomes imperceptible even as a CCVC signal is attenuated by thicker dielectric layers. Under these conditions, the prior art high-energy CIVA may be advisable; but low-energy CIVA should be applied first because of its almost totally non-destructive nature.

The low-energy CIVA method and apparatus as disclosed herein may also be applied to ICs formed from other semiconductor materials including but not limited to III–V semiconductors including gallium arsenide. Other applications and variations of the low-energy CIVA method and apparatus will become evident to those skilled in the art.

What is claimed is:

1. A scanning electron microscope system for identifying and mapping any open-circuit defects in an integrated circuit, the scanning electron microscope system comprising:

(a) a stage for holding the integrated circuit and making a plurality of electrical connections thereto;

(b) a focused electron beam source having an energy sufficiently low to prevent any electrical breakdown of a passivation layer of the integrated circuit;

(c) means for scanning the focused electron beam source over a device surface of the integrated circuit, the scanning means further comprising a position signal; and (d) a constant-current electrical source connected to the stage to supply power to the integrated circuit, the constant-current electrical source further comprising a signal voltage that changes in response to the focused electron beam, whereby any open-circuit defects in the integrated circuit are identified and mapped.

2. The scanning electron microscope system in claim 1 further comprising a secondary electron detector for forming a secondary electron image of the integrated circuit.

3. The scanning electron microscope system in claim 2 further comprising a display means for forming a composite image of any open-circuit defects in the integrated circuit, the display means comprising a plurality of electrical inputs, the electrical inputs further comprising the signal voltage, the position signal, and a secondary electron signal from the secondary electron detector.

4. The scanning electron microscope system in claim 1 further comprising a switch matrix for controlling the electrical connections to the integrated circuit.

5. The scanning electron microscope system in claim 4 in which the switch matrix is computer controlled.

6. The scanning electron microscope system in claim 1 further comprising a voltage amplifier for amplifying the signal voltage.

7. The scanning electron microscope system in claim 6 in which the voltage amplifier is an ac-coupled voltage amplifier.

8. The scanning electron microscope system in claim 1 in which the focused electron beam energy is in the range from about 300 to about 1,500 electron volts.

9. An apparatus for identifying and mapping any open-circuit defects in an integrated circuit, the apparatus comprising:

(a) a stage for holding the integrated circuit and making a plurality of electrical connections thereto;

(b) a focused electron beam source having an energy sufficiently low to prevent any electrical breakdown of a passivation layer of the integrated circuit;

(c) means for scanning the focused electron beam source over a device surface of the integrated circuit, the scanning means further comprising a position signal;

(d) a vacuum chamber encompassing the stage, the focused electron beam source, and the electron beam scanning means, the vacuum enclosure comprising a plurality of electrical feedthroughs; and (e) a constant-current electrical source connected to the stage to supply power to the integrated circuit, the constant-current electrical source further comprising a signal voltage that changes in response to the focused electron beam, whereby any open-circuit defects in the integrated circuit are identified and mapped.

10. The apparatus in claim 9 further comprising a secondary electron detector for forming a secondary electron image of the integrated circuit.

11. The apparatus in claim 10 further comprising a display means for forming a composite image of any open-circuit defects in the integrated circuit, the display means comprising a plurality of electrical inputs, the electrical inputs further comprising the signal voltage, the position signal, and a secondary electron signal from the secondary electron detector.

12. The apparatus in claim 9 further comprising a switch matrix for controlling the electrical connections to the integrated circuit.

13. The apparatus in claim 12 in which the switch matrix is computer controlled.

14. The apparatus in claim 9 further comprising a voltage amplifier for amplifying the signal voltage.

15. The apparatus in claim 14 in which the voltage amplifier is an ac-coupled voltage amplifier.

16. The apparatus in claim 9 in which the focused electron beam energy is in the range from about 300 to about 1,500 electron volts.

17. A method for identifying and mapping any open-circuit defects in an integrated circuit with a scanning electron microscope, comprising the steps of:

(a) placing at least one integrated circuit comprised of a semiconductor on a stage in the scanning electron microscope, the stage making a plurality of electrical connections to the integrated circuit;

(b) irradiating a portion of a device surface of the integrated circuit with a focused electron beam of the scanning electron microscope, the focused electron beam having an energy sufficiently low to prevent any electrical breakdown of a passivation layer of the integrated circuit;

(c) scanning the focused electron beam over the integrated circuit with an electron beam scanning means of the scanning electron microscope, the electron beam scanning means further comprising a position signal;

(d) supplying power to the integrated circuit with a constant-current electrical source, the constant-current source comprising a signal voltage that changes in response to the focused electron beam, whereby any open-circuit defects in the integrated circuit are identified and mapped.

18. The method in claim 17 further comprising generating an image of any open-circuit defects in the integrated circuit with a display means, the display means comprising a plurality of electrical inputs, the electrical inputs further comprising the signal voltage and the position signal.

19. The method in claim 18 further comprising generating a composite image of any open-circuit defects in the integrated circuit with the display means with an electrical input from a secondary electron detector.

20. The method in claim 17 further comprising controlling the electrical connections to the integrated circuit with a switch matrix.

21. The method in claim 20 in which the switch matrix is computer controlled.

22. The method in claim 17 further comprising amplifying the signal voltage with a voltage amplifier.

23. The method in claim 22 in which the voltage amplifier is an ac-coupled voltage amplifier.

24. The method in claim 17 in which the focused electron beam energy is in the range from about 300 to about 1,500 electron volts.

* * * * *